United States Patent
Weinstein

(10) Patent No.: US 7,667,562 B1
(45) Date of Patent: Feb. 23, 2010

(54) MAGNETIC FIELD REPLICATOR AND METHOD

(76) Inventor: Roy Weinstein, 747 International Blvd. No. 10, Houston, TX (US) 77024

(*) Notice: Subject to any disclaimer, the term of this patent is extended or adjusted under 35 U.S.C. 154(b) by 0 days.

(21) Appl. No.: 07/481,576

(22) Filed: Feb. 20, 1990

(51) Int. Cl.
*H01F 7/00* (2006.01)
*H01F 1/00* (2006.01)
*H01F 6/00* (2006.01)

(52) U.S. Cl. .............. 335/216; 335/298; 335/278; 335/302; 335/304; 335/300; 335/306; 505/776; 505/777; 505/778; 505/779; 505/780; 505/781; 505/803; 505/879; 505/924; 29/519; 310/10

(58) Field of Classification Search ........... 335/216, 335/296–306, 278; 505/776–781, 803, 879, 505/924; 29/599, 519; 310/10; 324/318–321
See application file for complete search history.

(56) References Cited

U.S. PATENT DOCUMENTS

| 4,176,291 A | * | 11/1979 | Rabinowitz ................ 310/52 |
| 4,190,817 A | * | 2/1980 | Rabinowitz ............... 335/216 |
| 4,377,905 A | * | 3/1983 | Agatsuma et al. .......... 29/599 |
| 4,578,663 A | * | 3/1986 | Sanders et al. ............ 335/302 |
| 4,722,134 A | * | 2/1988 | Wilson .................... 29/599 X |
| 4,786,886 A | * | 11/1988 | Tada ..................... 335/300 X |
| 4,835,137 A | * | 5/1989 | Leupold ................. 335/216 X |
| 4,861,752 A | * | 8/1989 | Leupold ................. 335/216 X |
| 4,870,052 A | * | 9/1989 | Engler et al. ............... 505/120 |
| 4,920,095 A | * | 4/1990 | Ishigaki et al. .......... 335/216 X |
| 4,939,493 A | * | 7/1990 | Krienin ................. 335/216 X |
| 4,942,379 A | * | 7/1990 | Ogawa et al. ............. 335/301 |
| 4,952,555 A | * | 8/1990 | Sibata ................... 505/780 X |
| 4,956,336 A | * | 9/1990 | Salama et al. ............ 505/450 |
| 4,996,192 A | * | 2/1991 | Fleischer ................. 505/126 |
| 4,999,322 A | * | 3/1991 | Reick ................... 505/780 X |
| 5,071,826 A | * | 12/1991 | Anderson et al. .......... 505/445 |
| 5,133,170 A | * | 7/1992 | Lewis et al. ................ 53/252 |
| 5,306,697 A | * | 4/1994 | Salama et al. ............. 505/126 |
| 5,377,141 A | * | 12/1994 | Takemura ................. 365/160 |

FOREIGN PATENT DOCUMENTS

| JP | 62-1206 | * | 1/1987 | .............. 505/924 |
| JP | 63-207009 | * | 8/1988 | .............. 505/1 |
| JP | 63-283003 | * | 11/1988 | .............. 335/216 |

(Continued)

OTHER PUBLICATIONS

An Ivestigation of the Very Incomplete Meissner Effect. M. Rabinowitz, Garwin and Frankel, Stanford University, pp. 1-4, Feb. 23, 1973.*

(Continued)

*Primary Examiner*—Elvin G Enad
*Assistant Examiner*—Mohamad A Musleh
(74) *Attorney, Agent, or Firm*—Lee D. Weinstein

(57) ABSTRACT

A new class of fundamental devices and methods for their manufacture and use. The bulk magnetic field replicators of the present invention require no precision machining or alignment to accurately reproduce magnetic fields of any complexity, nor extreme positional stability to maintain superconductivity. Such bulk devices may be formed of either low or high critical temperature superconductive materials, but are particularly adapted to formation from high critical temperature materials.

94 Claims, 7 Drawing Sheets

FOREIGN PATENT DOCUMENTS

JP 64-28228 * 1/1989 .................. 505/781

OTHER PUBLICATIONS

G. J. Yurek et al, *Superconducting Microcomposites by oxidation of Metallic Precursors*, Journal of Metals, Jan. 1988 p. 16-18.*

H. Küpfer, *Fast Neutron Irradiation of $YBa_2Cu_3O_7$*, Condesed Matter vol. 69 (1), Nov. 1987.*

Wisniewski, A., *Magnetization Studies of $YBa_2Cu_3O_{7-A}$ Irradiated by Fast Neutrons* Solid State Communications, vol. 65, No. 7, pp. 577-580, Feb. 1988.*

Wenger, *Observation of Superconducting Current in La-Ba-Cu-O at 28 K*, Oct. 29, 1987 Received at PTO Library.*

* cited by examiner

 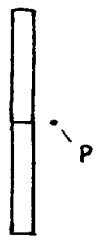 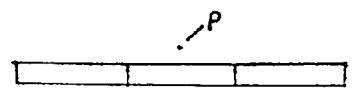
FIG. 12A   FIG. 12B   FIG. 12C
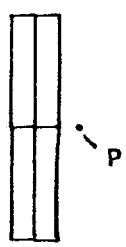 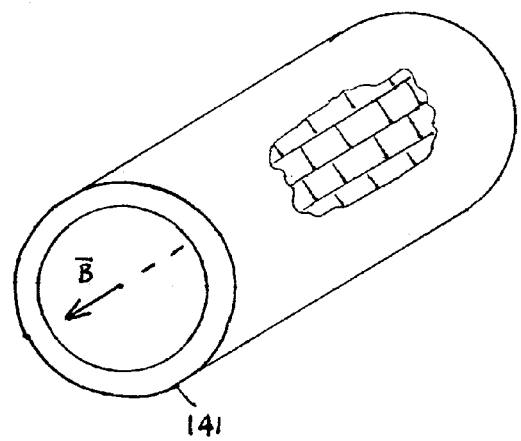
FIG. 13   FIG. 14

MAGNETIC FIELD REPLICATOR AND METHOD

BACKGROUND OF THE INVENTION

This invention relates generally to a class of devices known as magnetic field replicators and to methods for their creation, operation and uses. Although it is not so limited, it is particularly useful for replicating complex fields with high precision, low weight and low cost, and in short real times. It may also replicate strong or very strong magnetic fields, and can produce magnets of large surface area. In addition, these replicators can also be used in much smaller devices such as for field magnets of generators.

There are many applications for which a high strength magnetic field and/or a complex, highly precise field are not only highly desirable but virtually mandatory. The conventional procedure has been to employ windings about an iron core machined to produce the shape and intensity of field desired. While this approach has been adequate in many circumstances, it suffers from some notable deficiencies. Typically, the iron or ferrous material core must be machined to a very close tolerance, often 0.001 of an inch, which makes the resulting product quite expensive. Obtaining such a precisely-machined magnet several meters in size to produce a field strength of 20,000 gauss might cost on the order of a hundred thousand dollars or much more, and the final product might well weigh from one ton to tens of tons. Higher strength magnets of conventional design are obtainable only at still higher costs and weights, perhaps exponentially higher. Additionally, since iron magnets wound with conventional wire dissipate a great deal of power, sometimes hundreds of kilowatts, operating such magnets can be both quite costly and difficult to schedule with power companies.

Since iron saturates in the region of 20,000 to 30,000 gauss, higher fields are presently created by windings of superconducting wire which, due to the high fields, are subject to tremendous forces. If such wire moves or flexes by just a very small amount, the superconducting property is often lost or, in the terms of the art, a "quench" is said to have occurred. Creating high strength superconducting magnets requires an exceedingly great precision of support and windings, at a corresponding cost. For example, a solenoidal, superconducting wire-wound magnet, two meters long and one meter in diameter, might cost several million dollars.

Attempts have been made, in instances where a number of identical field sources were desired, to manufacture only one such expensive conventional magnet and to duplicate the field by placing a magnetizable material in close proximity to the high strength field. With the discovery of superconducting material—i.e., material capable of conducting an electric current with no resistance and no losses—it was thought logical to try to impress the desired field pattern in a magnet of such material. However, another characteristic of such materials is the tendency to expel all internal magnetic fields when the critical temperature, $T_c$—the temperature below which superconductivity occurs—is achieved. This characteristic is now known as the Meisner Effect. Conflicting characteristics of the superconducting materials therefore existed—i.e., a material thought to be ideal in many respects was at hand, but the superconductivity material would expel the impressed magnetic field upon achieving the superconducting state.

In the mid-1970's, Mario Rabinowitz and colleagues at the Stanford Linear Accelerator Center, using materials which exhibited superconductivity only when within a few degrees of absolute zero, discovered that by causing imperfections in the material, for example by work hardening, the magnet would not expel all magnetic lines of force from within the material when, while subject to a magnetic field, its temperature was taken below the critical temperature. This discovery was dubbed the "Incomplete Meisner Effect", and the retention of a very strong magnetic field by superconducting materials is now known as the "Very Incomplete Meisner Effect", or VIME.

Superconducting materials for which the Meisner Effect is literally true—i.e., materials which completely expel all of their internal magnetic fields when the magnetic field strength is less than the critical field strength, $H_C$—are known as Type I superconductors. Superconducting materials for which the Meisner Effect is not literally true—i.e., those which demonstrate either the Incomplete Meisner Effect or the Very Incomplete Meisner Effect—are known as Type II superconductors. Additionally, in Type I SC's, the magnetic field is totally penetrating—i.e., completely contained within the body of the SC—when the strength of the magnetic field is greater than the critical field strength, $H_C$, and the property of superconductivity is lost, whereas in a Type II SC, the magnetic flux lines penetrate the body when the field strength is greater than a first critical level HC1, but the superconductivity property is not lost until the field strength exceeds a second critical level, $H_{C2}$. This "window", for the Incomplete or Very Incomplete Meissner effect, allows the theoretical possibility for retention of strong magnetic fields in bulk SC materials, which is fundamentally different from creation of such fields by currents through wires or ribbons.

Further, all superconducting materials must be maintained at temperatures below their respective critical temperatures, $T_c$, in order to maintain their superconductivity; the respective temperatures at which such materials lose their superconductivity properties forms the basis for a further classification of such materials. Superconductors which are able to maintain their superconductivity property only within a few degrees of absolute zero are known as low critical temperature or low $T_c$ superconductors, while superconductors which are able to maintain that property at much higher temperatures are known as high $T_c$ superconductors. In a practical sense, materials which become superconducting below the temperature of liquid nitrogen require liquid helium as a coolant. Materials which become superconducting above the temperature of liquid nitrogen can use liquid nitrogen as a coolant. Since liquid nitrogen is much cheaper and easier to handle than liquid helium, it is convenient, from a practical standpoint, to take the dividing line between low $T_c$ and high $T_c$ superconductivity as the temperature of liquid nitrogen even though this temperature may not represent the actual demarcation line between these two classes of materials. In a historical sense, the high $T_c$ superconductors were the first to exhibit superconductivity above temperatures of about 30 Kelvin.

Rabinowitz' work, so far as is known to date, is limited to the class of superconductors known as metallic superconductors, which to date are further limited to temperatures within a very few degrees of absolute zero (30 K or less). This limitation requires the use of liquid helium as the coolant, which not only greatly increases the cost but which, due to extreme difficulties of handling, greatly limits the practical applications of such devices. According to "Dependence Of Maximum Trappable Field On Superconducting $Nb_3Sn$ Cylinder Wall Thickness", M. Rabinowitz et al., Applied Physics Letters 30, 607, 1977, Rabinowitz's results were achieved through the use of multiple layers of $Nb_3Sn$ foils formed in the shape of a cylinder by helically wrapping the ribbons of superconducting foil around a mandrel. While satisfactory for laboratory experiments, the practical limitations of such delicately-constructed materials are obvious.

U.S. Pat. No. 4,176,291, "Stored Field Superconducting Electrical Machine And Method", to Rabinowitz, discloses the employment of a metallic superconductor known as "A-15, beta-tungsten structure" superconductor formed in the shape of cylinders. These cylinders are formed in concentric layers of superconducting materials and thermally and electrically conductive materials in order to insulate the magnetic field replicator from thermal and electromagnetic forces and from heat build up which might otherwise cause the extremely low $T_c$ of the Rabinowitz device to be exceeded, with resultant loss of superconductivity and the impressed magnetic field. Rabinowitz discloses the use of the "warm process" method to impress the desired field in his specialized cylinder, and states that with that process he has been able to store a magnetic field in the superconductor of up to about one-half $H_{c2}$.

U.S. Pat. No. 4,190,817, "Persistent Current Superconducting Method And Apparatus", to Rabinowitz, discloses, for low $T_c$, metallic superconductors, various means for varying the field, for creating complex and/or spatially large fields, and for miniaturizing fields, as well as means for increasing the fidelity, magnitude, and stability of the magnetic field stored in such low $T_c$ superconductors.

U.S. Pat. No. 4,096,403, "Superconducting Hybrid Magnetic Flux Pump", also to Rabinowitz, discloses various arrangements for magnetic flux pumps. None of the Rabinowitz references discloses high $T_c$, bulk superconductors.

With the relatively recent discovery of the new class of superconducting materials known, relatively, as 'high temperature' superconductors, a number of researchers have attempted to use such materials to replicate high intensity magnetic fields. However, it has been found that this may not be accomplished simply by extending Rabinowitz' work to such materials; rather, this new class of superconducting materials has its own, unique problems which must be overcome before such materials may successfully be used as magnetic field replicators.

One such problem not found with low $T_c$ SC's, and a paramount problem for high $T_c$ SC's, is the tendency for the retained or "trapped" field strength, $B_T$, of such materials to undergo time decay. Representative of this relationship is the graph of FIG. 15 of retained field strength, $B_T$, as a function of time displayed logarithmically:

The field strength, which decays with time logarithmically, does so initially at a precipitous rate, and then abruptly changes to a more moderate rate of decline. The decay rate following this inflection point is referred to as "Creep", or "flux creep", analogous to the dislocation line movement in crystalline materials. With low $T_c$ SC's, some of the field strength is lost—i.e., some magnetic flux lines escape—within very short time periods (on the order of 10 seconds), but thereafter the field appears to stabilize and, within the time limits of the Rabinowitz experimenters, the loss appears to be virtually zero. In the aggregate, with low $T_c$ materials, creep is minor, and the trapped field may persist for millenia. In the newer high $T_c$ materials, the creep can reduce the trapped field by several percent in one week and is referred to as "Giant Creep". While some applications are possible in high $T_c$ materials in spite of the Giant Creep phenomena, many more applications would be possible if the phenomena were eliminated, significantly reduced, or otherwise overcome or controlled.

Still another difficulty confronting the high temperature superconductivity researcher is that the superconductivity property is not isotropic, i.e., is not uniform in all directions. Typically, the SC property is manifested in only two directions, i.e., a plane, and is smaller, or non-existent in a direction perpendicular to this plane. It was long thought that the SC phenomenon was confined to a plane at the surface of a superconducting conductor, and it was therefore thought that this limited available volume for trapping would impose significant limitations on the strengths of the fields which could be trapped. Simultaneously, since it was also thought that the fields could be trapped only in the direction perpendicular to the SC plane, serious reservations existed in most quarters of about the prospects of ever developing strong, practical, high $T_c$ SC magnetic replicators.

SUMMARY OF THE INVENTION

A new class of fundamentally different devices and methods for the practical manufacturing of such devices have been developed. Magnets twice the strength of the largest present practical superconducting magnets, if not greater, may be produced by the principals of this invention. These devices are not ordinary permanent magnets, and are unlike previous superconducting magnets. They are far simpler and fundamentally different devices, and have great applicability because they do not require geometric or dimensional precision. Normally, superconducting magnets of the previously known types have relied upon precisely aligned current-carrying wires or ribbons to create desired field shapes. Permanent magnets also rely upon precise geometry of the magnetic materials to produce a given field design. This new class of fundamentally different devices, which may be called superconducting magnet replicators, functions by trapping an external magnetic field which is maintained by large numbers of localized, persistent SC currents also be called microcurrents, by relatively larger currents which may circulate throughout the volume of the SC replicator, or by a combination of these two types of currents. Physically, the replicators behave similarly to permanent magnets but do not require precise geometry. For example, they may be transferred and used where needed without electrical leads or connections. However, unlike wire-wrapped or ribbon-wrapped SC magnets, and unlike permanent magnets, the geometric shape and accuracy of the body of the SC replicators have little effect upon the shape and accuracy of the magnetic field which may be replicated. By following the procedures of the present invention, the proper number, size, and orientation of a multitude of persistent currents may be created, thereby producing a faithful copy of the magnetic field of almost any "parent" magnet that may be desired.

It has been found that most if not all parent magnetic fields can be conveniently captured and retained by a high $T_c$ SC replicator formed in the shape of a hollow member such as a cylinder. Such a convenient shape may be formed by packing and pressing high $T_c$ SC powders followed by sintering at high temperature. "1,2,3" material has been found satisfactory for such powders, i.e., material of the class $YBa_2Cu_3O_{7-x}$, as have many other materials. Alternatively, improved cylinders can be fabricated out of thin, small-area grains. Salama et al. and Jin et al. ["High Current Density in Bulk $YB_{a2}Cu_3O_{7-x}$ Superconductors", K. Salama et al., Appl. Phys. Lett. 54, 2352, 1989, and "Large Magnetic Hysteresis in a Melt Textured Y—Ba—Cu—O Superconductor", S. Jin et al., Appl. Phys. Lett., 54, 584, 1988], have shown that large current densities ($J_c$), on the order of $10^5$ amp/cm², can be achieved in bulk materials by partial melting-solidification techniques.

An improved cylinder may be processed by directional partial melting-solidification along the large axis to grow large and preferably-oriented superconducting crystals or grains, or, alternatively, the cylinder can be fabricated from smaller grains, separately produced in a simpler geometry. It is to be understood that the cylindrical shape, while convenient and useful, is not essential: for example, dipole and quadrapole fields may be replicated very well by square-pipe shaped replicas.

As implied by the foregoing, it has been found that imperfections permit the retention of larger fields. In addition, it has been found that more profuse imperfections permit the retention of still larger fields, as do imperfections which, while still microscopic, are larger than atomic imperfections.

One satisfactory method of creating imperfections is to introduce silver to the "1,2,3" material while in the powdered form. The introduction of silver increases the maximum field which may be trapped, and makes it easier to produce uniform materials.

It has also been found that the greater the degree of homogeneity of imperfections, the more nearly perfectly the parent field may be reproduced. Radiation induced imperfections may be still more effective in retaining induced fields. It has also been found that larger oriented grains retain higher fields. In addition to trapping larger fields in all directions, they trap fields most efficiently in the direction perpendicular to the preferred conduction plane of the material.

In addition to new and better individual devices and new methods for their manufacture, various means have been found for assembling multiple individual replicators so as to achieve many advances over the prior art, including: a great increase in the strength of the trapped field; more accurate reproduction of the shape of an impressed field; means for varying the effective field of the replica after it has been produced; means to diminish the Giant Creep Effect and/or to manage such effects so as to reduce them to tolerable levels; means for minimizing the costs of activating magnets; and means for producing more uniform trapped fields in non-uniform samples. Two of these methods of fabrication are referred to as the "laminate" method and the "mosaic" method. In either of these methods, a "chip"—which may be either planar or curved—may be employed, and it is to be understood that the direction of greatest field strength is normal or nearly normal to the preferred conduction plane of the chip. The term "laminate" may be thought of as applying to any method of stacking such chips parallel to the direction of trapped field, while the term "mosaic" may be thought of as applying to any method of arranging such chips perpendicular to the direction of trapped field. In the "laminate" method, two or more such chips may be stacked or "laminated" together and then activated; if two such chips are so laminated and then activated, then the resultant field strength, B, will, except for geometric effects, be very nearly twice the field strength obtainable from one such chip. With the mosaic method, the chips may be activated either before or after assembly, as desired. A large number of chips with identical fields, if desired, could be assembled "edge-to-edge" on a surface to create a very strong, uniform field over a relatively large spatial distance, or, if desired, chips with different fields could be utilized to create a complex field. If the desired, spatially large and complex field already exists, a large number of un-activated chips may be simply arranged in a mosaic pattern and then activated to quickly and accurately capture and reproduce the complex field pattern.

In some applications during lamination or mosaic assembly, it may be desired to keep the preferred conduction planes of all chips parallel to one another. In other applications it may be desirable to purposefully select chips with random preferred direction. For example, if the strongest possible uniform trapped field is desired, the chips might be assembled with all preferred conduction planes perpendicular to the uniform field. Alternatively, if uniform response is desired to fields in several directions, then assembly of ships with preferred planes purposefully randomized may be desirable.

Where weight is a consideration, such as in space applications, a light, small surface area activating magnet can be used to activate mosaic components. These components may then be assembled to create a large surface area magnet. Thus for example, a large area dipole replica may be constructed although only a small area activator is present.

Also as implied by the foregoing, the power dissipation characteristic of conventional magnets is eliminated by the bulk replicators of the present invention.

PREFERRED EMBODIMENTS

A high $T_c$ SC replicator may be formed in virtually any desired shape by packing and pressing "1,2,3" powder and then sintering at high temperature. For example, hollow circular cylinders have been found particularly advantageous for many applications, while other hollow forms, such as squares or other polygons, and various solid forms have been found advantageous for still other applications. Alternatively, the high $T_c$ SC replicator may be formed by melting-solidification methods, or by lamination and mosaic fabrication. The replicator formed by any of these methods may be improved by proton, neutron, or other heavy particle bombardment, or it may be improved by the admixture of impurities such as silver, or the Lanthanide group, or it may be formed by any method which allows high persistent currents at high magnetic fields. It may also be fabricated out of sections produced by any of these methods.

In addition to $YBa_2Cu_3O_{7-x}$, material of the class $RBa_2Cu_3O_{7-x}$, where R is a lanthanide element other than lanthanum, cerium, praseodymium, promethium or terbium, is also satisfactory, as are the superconductive bismuth-strontium-calcium-copper-oxygen compounds and the superconductive thallium-barium-calcium-copper-oxygen compounds. Satisfactory results may also be obtained with mixtures of $YBa_2Cu_3O_{7-x}$ and $RBa_2Cu_3O_{7-x}$, where R may be any of the lanthanide elements, including those whose individual barium copper oxides are not satisfactory when formulated individually. In addition, any of the lanthanide element oxides are also satisfactory when formulated as mixtures of at least two or more of such materials. For many applications, it may be preferable for the replicators to contain compounds of differing critical temperatures.

In the "warm" activation method, a warm SC cylinder is placed in a preexisting magnetic field perpendicular to the axis of the cylinder and then cooled through the transition temperature. In the "cool" activation method, the SC cylinder is first cooled into its superconductivity state and then an external field is turned on to a magnitude exceeding $H_{c1}$ of the SC. In both methods, part of the field is retained, or "captured", in the SC cylinder when the external field is turned off. With the cool method, as the external field is first turned on and increased from zero, the SC repels all flux lines (or virtually all flux lines) from the interior of the body of the SC until some threshold level of external field is applied. This threshold level, or $B_{shield}$, is the amount of magnetic field, B, that can be repelled or "shielded" from the SC. Once $B_{shield}$ is reached or exceeded, the external magnetic field "punches through" the exterior of the SC and B interior to the SC initially rises rapidly and then more slowly thereafter. While the strength of the exterior field is still increasing, the interior level typically lags behind the level of the exterior field. Upon decreasing the external field, the internal field similarly decreases but follows a hysteresis pattern, which results in a field intensity level which exceeds the level of the external field over most of the decline. A trapped field, $B_T$, results.

For many applications, it is highly preferable to know the maximum field which can be trapped in any given sample, and the activating field needed to accomplish this, before, for example, expensive magnets are created or purchased to apply the activating field. A relationship between the strength of the field which can be trapped and the activating field has been found which can be used to predict not only the maximum trappable field for any given sample but also the field which can be expected to be retained for any strength of activating field. This relationship has been found to be, approximately:

$$B_T = B_T(\max)[1 - e^{-cBo/B_{T(max)}}]$$

For a new sample, in which $B_{T(max)}$ is unknown, a few values of actuating field, $B_o$, may be applied, $B_T$ and the constant c determined empirically, and $B_{T(max)}$ computed from this relationship. Once $B_{T(max)}$ is known for any given sample, the field which may be trapped with any given actuating field may be determined beforehand with considerable accuracy. For example, for a given sample with $B_{T(max)}$ of 20,000 Gauss and c=1, various values of the activating field, $B_o$, will produce approximately the following values of trapped field, $B_T$:

| $B_O$ (Gauss) | $B_T$ | $B_T/B_T(MAX)$ |
|---|---|---|
| 0 | 0 | 0 |
| 10,000 | 7,869 | 0.39 |
| 20,000 | 12,642 | 0.63 |
| 30,000 | 15,537 | 0.78 |
| 40,000 | 17,293 | 0.86 |
| 50,000 | 18,358 | 0.92 |
| 60,000 | 19,000 | 0.95 |
| 80,000 | 19,634 | 0.98 |
| 100,000 | 19,865 | 0.99 |

The relationship may also be thought of as describing a saturation effect. From the examples, it may be seen that the first 40,000 Gauss of activating field, $B_o$, will result in a trapped field of 17,293 Gauss, whereas an additional 40,000 Gauss would result in an increase of the trapped field of only 2,341 Gauss. If the activating field is to be produced by an expensive magnet, then it may be highly preferable for economic reasons to construct the activating magnet to provide activating fields no greater than 30,000 or 40,000 Gauss.

For some applications, cylindrical high $T_c$ SC's are referred, while pipes of square or other cross section, or chips or disk-shaped high $T_c$ SC's are preferred for other applications. The following examples illustrate some results achieved from applying the techniques of the present invention to magnetize either individual chips or cylinders.

Example I

| Retained Field, $B_T$(Gauss) | | |
|---|---|---|
| Disk | Cylinder | Material/Condition |
| 2 | 10 | Ordinary 1,2,3 |
| 4.5 | 18 | Optimum Thickness 1,2,3 |
| 10 | 50* | Ag added |
| 80 | 700* | Mm-size, single oriented grain |
| 380 | 4000* | Cm-size oriented grain, no Ag |
| 600 | 6000* | Saturating parent field, no Ag, cm-size grain, not oriented |
| 1285 | 6000+* | Same, partially laminated |

Since production of cylinders presently is an order of magnitude more costly than production of simple disks, and since there is a relation between the fields that can be respectively trapped in disks and inside cylinders, cylinders were not manufactured in all cases. The entries marked with an asterisk are computed for cylinders based upon the results obtained with disks. The 600 and 1285 Gauss fields were retained in the disk over a many-day interval. A 6,000 Gauss dipole field can also be produced by using a plurality of such disks with laminate and/or mosaic assembly. A 9000 Gauss dipole field can be produced by using oriented grain chips, with the preferred conduction plane perpendicular to the desired field. Further, by adding silver in addition to proper orientation, a field on the order of 18,000 Gauss may be trapped. Much higher fields can be achieved for shorter time periods.

If an asymmetric field is not precluded, this may be readily obtained with pure 1,2,3 material and relatively high levels of trapped field. More uniform fields, and longer lasting fields, may be obtained at low $B_T$ levels with pure 1,2,3 material or at high $B_T$ levels with the addition of materials such as silver to the 1,2,3 powder. Generally, an addition of Ag in the range of five to twenty-five percent by weight produces improved results, with an addition of approximately fifteen percent being preferred at present. Example II shown in FIG. 16, illustrates the uniformity of field that may be obtained in a high $T_c$ SC replicator of 1,2,3 material with 15% Ag formed as a hollow cylinder or tube.

If only chips of poor uniformity are available, the magnitude of trapped field will vary across the sample. Nevertheless, more uniform fields may still be obtained, by one of several different methods. One method is to laminate poor samples and good samples in a random mixture; the average $B_T$ will approach a uniform value. Another method is to increase the size of the sample (for example, by increasing the area by mosaic assembly), thereby using the field region further away from the surface to obtain a more uniform field. Still another method of obtaining more uniform fields is by activation at a lower $B_T$. Generally, the uniformity increases greatly if the overall $B_T$ is about equal to or less than the $B_T(MAX)$ at the worst point at a saturating $B_o$. A field non-uniform at the surface will become more uniform as the distance from the surface is increased.

A highly preferred method of inducing highly homogeneous imperfections is that of radiation bombardment. In this method, gamma-ray bombardment is least preferred, neutron bombardment more preferred, and bombardment by any positively-charged ions such as protons most preferred. High energy, heavy particle bombardment permits much greater control of both spacing and depth of induced imperfections. If desired, a column of nuclei may be knocked out of the polycrystalline lattice with the resulting plurality of miniature dipoles all aligned. Any desired pattern may be created—i.e., one column out of ten, one column out of four, a "checkerboard" pattern, etc. For any given high $T_c$ SC material, there will be an optimum pattern of imperfections on the atomic scale which will permit the retention of the absolute maximum magnetic field for that material. Neutron bombardment has produced current densities 100 times greater than that obtained by chemical/physical deformations, or on the order of 200,000 amps/cm$^2$; the theoretical maximum with all variables optimized should be many times greater still. Heavy particle bombardment—either while in the SC state or prior—may also allow alignment of 'atomic' dipoles of grains not perfectly oriented, thus eliminating or at least largely bridging the grain boundary weak link effect of polycrystalline microstructures. In any event, it is clear that a new class of enormously powerful magnetic replicators has been created.

In addition to the large number of persistent micro-currents created, there may also be created one or more relatively large currents circulating either throughout the volume or body of the SC as a whole or through large portions of the SC. These large currents—analogous to an "eddy" current in conventional electromagnetic applications—may be created in the warm activation method by decreasing the external field, after activation, while maintaining the temperature of the SC replicator below $T_c$. Should such relatively large currents not be desired for any reason, use of the cool activation method will reduce them.

Such currents may also be reduced by employing multiple layers of thin mosaics separated by any material which is either insulating or at least non-superconducting at the temperatures of interest.

Various means for either eliminating or ameliorating the effects of the Giant Creep phenomenon have been developed. In samples of 1,2,3 materials, the Giant Creep effect is a diminution of retained B ($B_r$) at the rate of about seven to fourteen percent (7-14%) per week during the first week. With the discovery that the rate of decay is proportional not to time but to a logarithmic function of time, a 10% decline during the first week ($6 \times 10^5$ sec.) indicates a further 2% decline by sixty days ($6 \times 10^6$ sec.) and another 2% decline during the next eighteen months (i.e., til t=$6 \times 10^7$ sec.). Thus an aging program of roughly 2 to 5 months for 1,2,3 material will adequately stabilize the field for many so-called 'constant' field applications. Alternatively, individualized aging programs may be determined for particular samples to meet any required maximum permissible decay rate. It is expected that replicators with a larger number of imperfections and a more homogenous distribution of imperfections will be both more stable inherently and as well or better suited for inducing stability by aging. Example III, illustrated in FIG. 17, shows the "log time" relationship for a hollow cylinder of pure 1,2,3 material.

The low rate of decline of 4% over a 2-year period, after appropriate aging, may apparently be reduced even further by another technique. Example IV, shown in FIG. 18, utilizes a large grain sample about 1 cm×1 cm×1 mm, for which the maximum trappable field, $B_{T(max)}$, is 600 Gauss. If the field trapped, $B_T$, is near the maximum trappable B, then the Giant Creep effect will initially reduce the field at the rate of about 13% during the first week. However, if the field trapped is only a fraction of the maximum trappable $B_{T(max)}$, say, on the order of 25%, then the initial field decrease is less than 1.0% in the first week, which results in virtually no losses thereafter. As the maximum field which can be trapped increases, the field strength for which the Giant Creep effect is negligible also increases.

This latter technique also has important uniformity advantages. Example V, illustrated in FIG. 19, which utilizes a two-grain mosaic disk, illustrates a mapping of the trapped field, for various levels of applied fields, as the probe traverses the sample. By applying a field less than the strength of the field retained between the grain boundaries, a very uniform field strength may be obtained (bottom curve). For a sample of unknown characteristics, this may be obtained by first applying a relatively high field and mapping to determine the uniformity, and then, if insufficiently uniform, quenching and applying another field of strength less than the field retained between the boundaries and mapping the sample again. This "backing down" procedure may be repeated as necessary to obtain the degree of uniformity desired. It should also be noted that a non-uniform field across a sample will decay at different rates, as will samples of mixtures of different SC materials: whether this will be advantageous or something to be designed around will depend upon the particular application, but it should be understood that it is possible to produce a sample which will have one field profile at one instant in time and a different field profile at another point in time.

Contrary to expectations, retained fields in the planes perpendicular to the a,b plane (which is the plane of greatest current carrying capacity) of about two-thirds the strength of the a,b-plane retained field have been found.

In many applications, the ability to vary $B_T$ is desirable. This may be done in several ways. In applications such as accelerator beam-lines, long magnets are used. A long cylinder, activated as a dipole magnet, for example, may be comprised of shorter cylinders. For maximum field×length (which is the product of interest in beam-lines), the fields of all cylinders can be, for example, vertical. Field may then be decreased by rotating two cylinders by an angle, e, in opposite directions. These two cylinders behave as though their effective field is Bcos $\Theta$. Since $\Theta$ may be continuously varied, the effective field may be continuously varied.

Trim coils may be used in addition to the magnet replica to vary the field slightly, by conventional means.

Under some circumstances (for example, in which power conservation is the major motivation for using the replica), a framework of superconducting wires (or normal wires) may be used to provide a temporary (pulsed) field of the desired shape and magnitude. The replica can then be warmed, and then cooled again and recharged whenever desired, by pulsing the activating magnet.

IN THE DRAWINGS

Figure 3A:
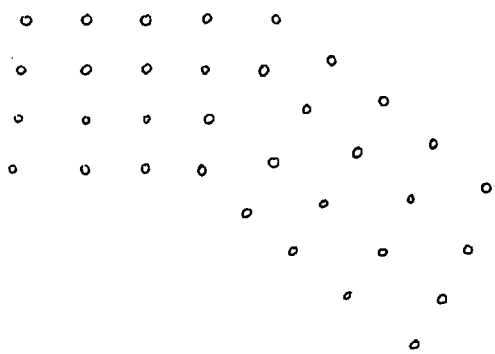
Figure 3B:
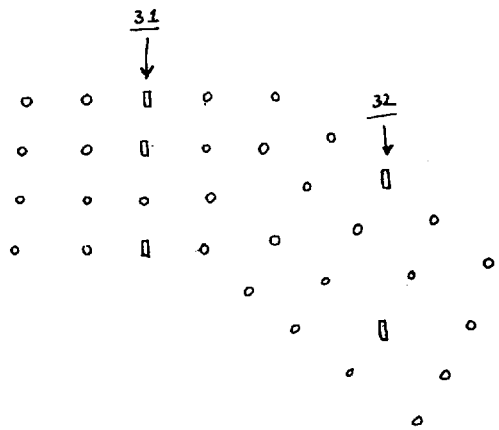

FIGS. 3A and 3B schematically represent, in vertical cross-section, a portion of a sample of a SC replicator comprising a mis-aligned grain boundary, before and after bombardment, respectively.

Figure 4:
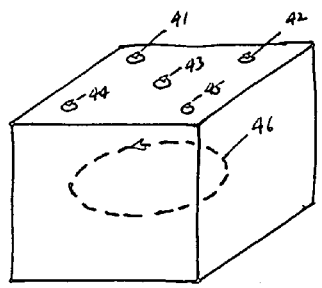

FIG. 4 is a schematic representation of a macroscopic-sized portion of a sample replicator, arbitrarily shown of rectangular configuration.

Figure 5:
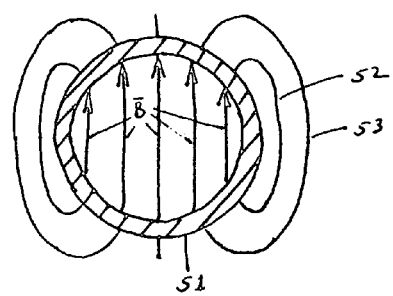

FIG. 5 is a vertical cross-section of a cylindrically shaped SC sample subsequent to activation.

Figure 6:
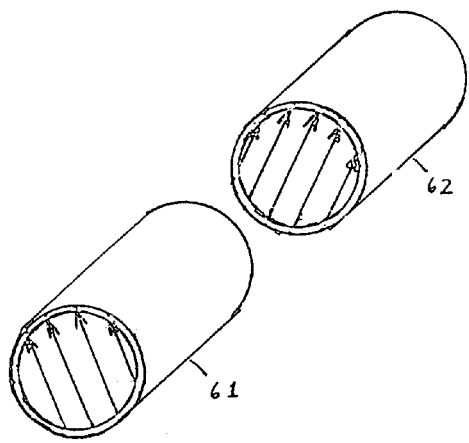

FIG. 6 is a perspective view of a pair of SC magnetic samples, in this instance shown as hollow cylinders, which have been rotated from an initial vertical alignment of the respective fields by an equal but opposite angle θ.

Figure 7:
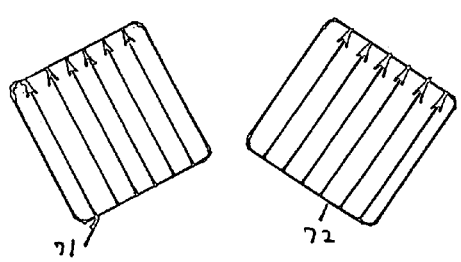

FIG. 7 schematically represents an end view of a pair of other SC magnetic samples which have been rotated from a vertical alignment of the respective fields by an equal but opposite angle θ.

Figure 8:
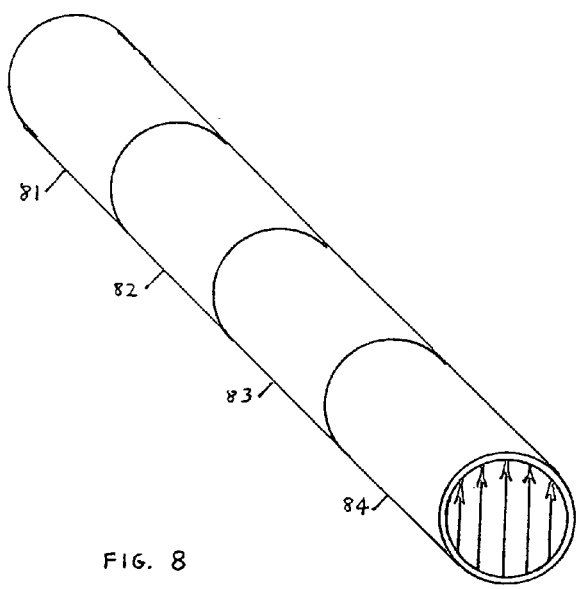

FIG. 8 is a perspective view of a series of SC magnetic replicas, again in this instance portrayed as cylindrical samples, stacked end-to-end.

Figure 9A:
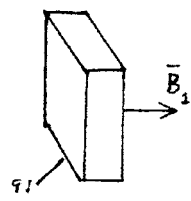
Figure 9B:
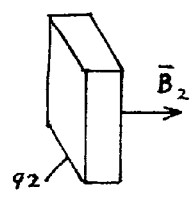
Figure 9C:
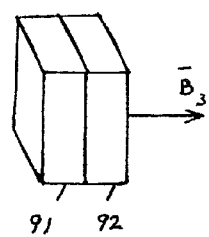

FIGS. 9A, 9B and 9C are perspective views illustrating one method of combining discrete SC magnetic replicas to obtain an increase in field strength.

Figure 10A:
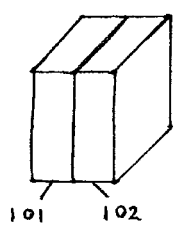
Figure 10B:
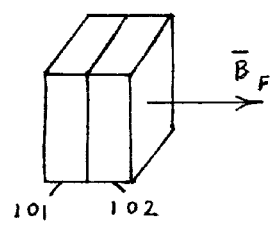

FIGS. 10A and 10B are perspective views illustrating another method of combining discrete SC magnetic replicas to obtain an increase in field strength.

Figure 11A:
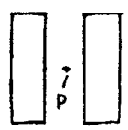
Figure 11B:
Figure 11C:

FIGS. 11A, 11B and 11C are schematic views of other methods of combining SC magnetic replicas, with the magnetic field vectors not shown for clarity.

FIGS. 12A, 12B and 12C are schematic views of still other methods of combining SC magnetic replicas, with the magnetic field vectors not shown for clarity. FIG. 12A depicts a pair of samples from a direction parallel to the direction of greatest field strength. FIG. 12B depicts the same samples rotated 90°, i.e., from a direction perpendicular to the direction of greatest field strength. FIG. 12C depicts three samples from the same direction on that of FIG. 12B, i.e., an "edge" view.

FIG. 13 is a schematic view from an edge of an assembly which has been assembled using both laminate and mosaic techniques.

FIG. 14 is a perspective view of a shaped structure, chosen for illustrative purposes as a cylinder, to which SC magnetic replicas have been applied in a mosaic manner.

Figure 15:
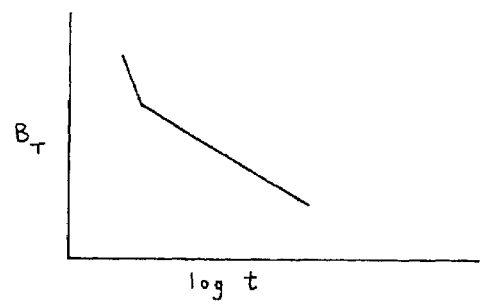

FIG. 15 is a graphical illustration of the functional relationship between retained field strength, $B_T$, and time, displayed logarithmically.

Figure 16:
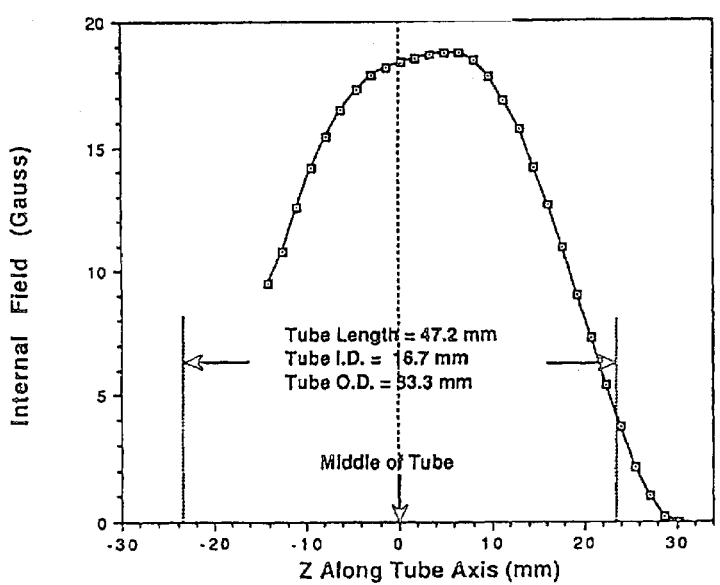

FIG. 16 is a graphical illustration of the uniformity of field that may be obtained in a high $T_c$ SC replicator of 1, 2, 3 material with 15% Ag formed as a hollow cylinder, or tube.

Figure 17:
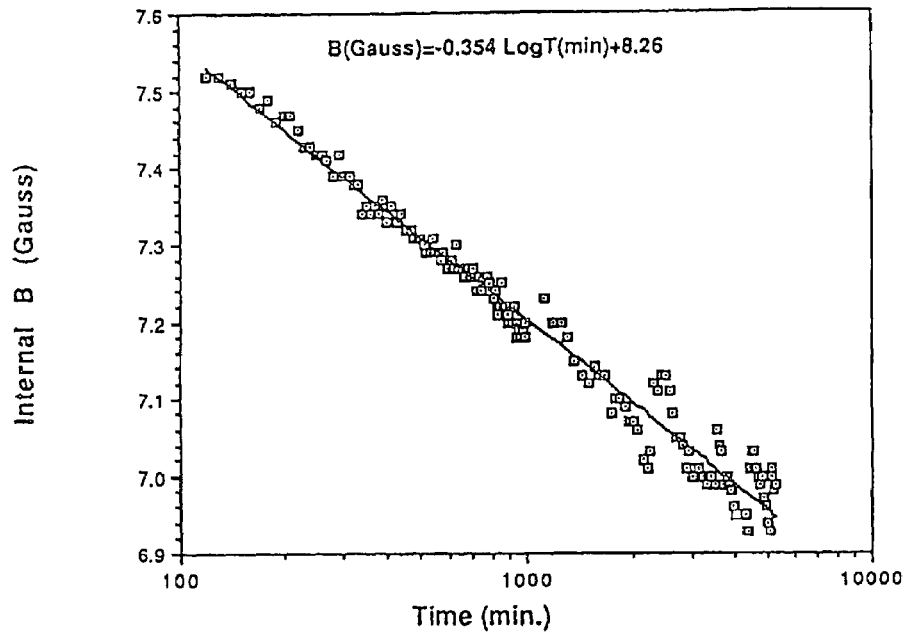

FIG. 17 is a graphical illustration of the Giant Creep effect in logarithmic time for a hollow cylinder of pure 1, 2, 3 material.

Figure 18:
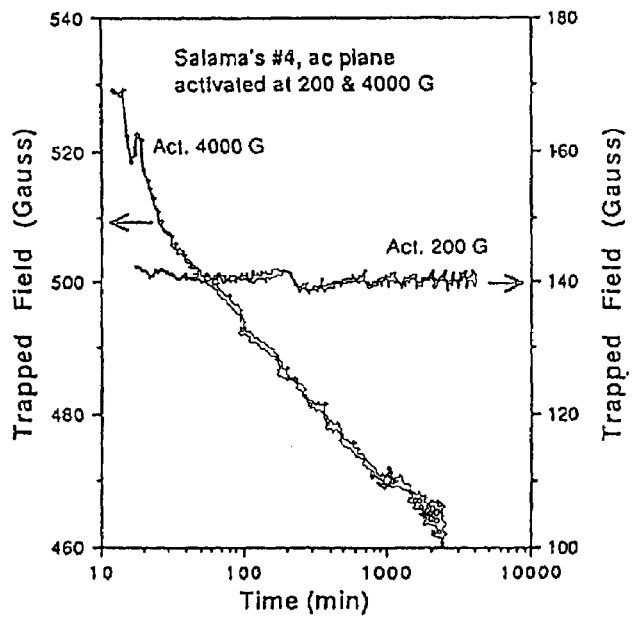

FIG. 18 is a graphical illustration of the relationship between the Giant Creep effect and the fraction of maximum trappable $B_T$ actually trapped.

Figure 19:
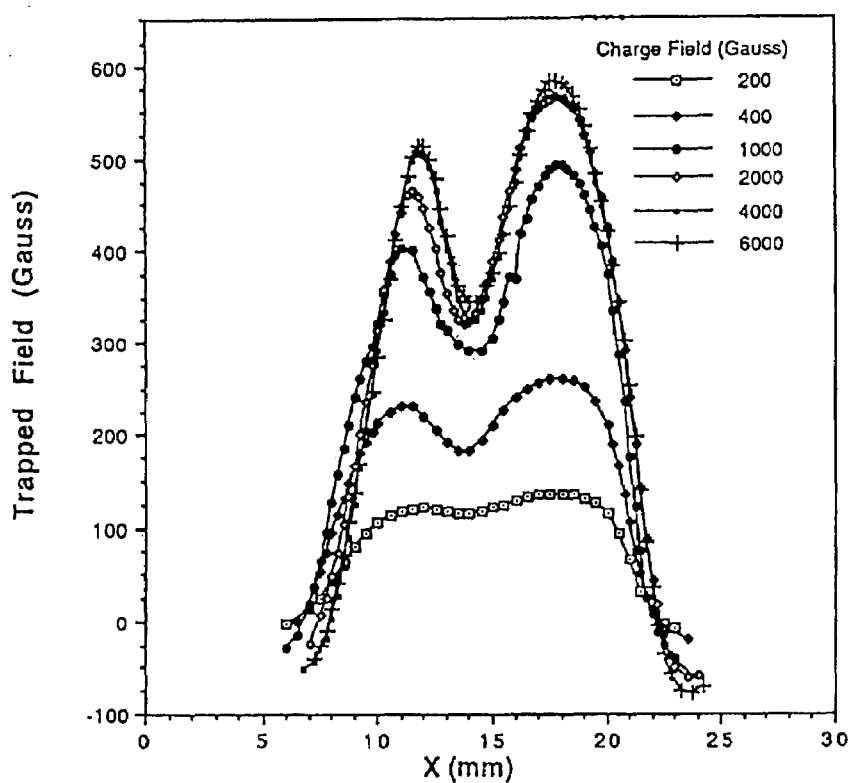

FIG. 19 is a graphical illustration of a preferred method for obtaining a more uniform field strength profile.

DETAILED DESCRIPTION

Figure 1:
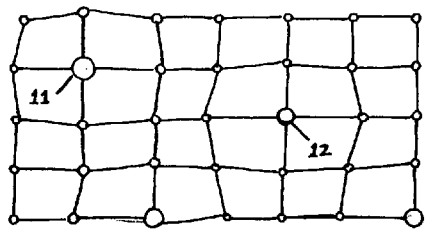
FIG. 1 is a plan view of a simplified schematic representation of a portion of a high $T_c$ SC magnetic sample whose lattice structure has been distorted by the addition of impurities.

Referring now to FIG. 1, there may be seen in plan view a simplified schematic representation of one of the simplest of many possible forms of distortion of a high $T_c$ SC replicator. The particular form illustrated is one layer only of a chemical/physical substitution of a few larger atoms or molecules for the smaller atoms of 'solvent' at the lattice points. The imperfections shown schematically may in some instances represent regions of poor superconductivity, and in other instances may represent regions of good superconductivity that become superconducting at temperatures different from adjoining regions. Persistent superconducting microcurrents may subsequently be induced in vortices around distorting positions such as 11 and 12, which such current vortices (and associated fields) may not cross, thus "trapping" or "pinning" such vortices and their resultant fields. No attempt has been made to depict distortions below a surface of such SC material. It is to be understood that such distortions may be introduced not only at the near-surface regions but at greater depths as well, even throughout the body of the SC if desired. It is also to be understood that the particular form of distortion illustrated is not to be limiting but merely exemplary of the almost unlimited number of means of introducing distortions into lattice structures. As but one example, the 'solute' atoms or molecules could just as easily be smaller than the 'solvent' atoms, and they could be dispersed at many locations other than at lattice points. They could also be imperfections which do not prevent superconductivity: they could, for example, just locally modify $T_c$.

Figure 2:
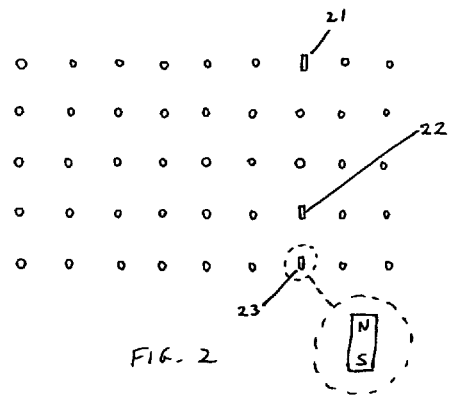
FIG. 2 is a simplified schematic representation of a portion of a sample which has undergone heavy particle bombardment.

FIG. 2 is intended as a simplified schematic representation of a portion of a sample which has undergone heavy particle bombardment, such as by neutrons, protons or the like. It may be considered to represent a vertical cross-section of a SC replicator which has been bombarded from the vertical direction and from which at least a portion of a column of nuclei has been ejected or at least displaced. The "holes" in the crystal are represented functionally by miniature bar magnets, since they will function as dipoles. Regardless of whether the bombardment may have occurred vertically or somewhat off the vertical, all the miniature dipoles (21 et seq.) will be perfectly aligned with the activating field. This feature, combined with the ability to create any pattern of distortions quite homogeneously, should allow the maximum field for any given material to be retained.

FIG. 3A schematically represents, in vertical cross-section, a portion of a SC replicator comprising a mis-aligned grain boundary before bombardment; FIG. 3B, the portion after bombardment. As may be seen from FIG. 3B, the 'dipoles' of the grain which was not aligned with the direction of bombardment, e.g., those of column 32, are nevertheless still aligned with the preferably-oriented dipoles of the grain which was so aligned, i.e., column 31, and are thus able to make the maximum possible contribution to the desired magnetic field.

As stated, the macroscopic-sized portion of the sample replicator of FIG. 4 was arbitrarily illustrated as of rectangular configuration; in practice, such samples may take almost any desired shape and need not, for example, be planar. The elements 41 through 45 are schematic representations of persistent microcurrents, shown, for clarity, on a surface only. For applications in which as strong a field as possible from a given sample is desired, such persistent microcurrents are preferably distributed throughout the volume or bulk of the SC replicator as a whole, preferably as profusely as possible. The more uniform the distribution, the more accurately most magnetic fields can be replicated. Also, the more uniform the distribution, the higher the maximum field that can be trapped.

With the cool activation method, the overall resultant field strength is mainly proportional to the total aligned persistent microcurrent since, to the extent shielding can be neglected, no relatively large persistent current flows will be established in the bulk of the SC replicator by the cool method. With the warm activation method, the overall resultant field strength may be thought of as comprising one or both of two components, one of which may be considered the resultant of the numerous persistent micro-currents. The other component may be considered the resultant of one or more relatively large persistent currents which circulate either through the bulk of the SC replicator as a whole or through relatively large portions of the replicator. Element 46 is a schematic representation of one such relatively large, bulk-circulating, persistent current.

FIG. 5 portrays a vertical cross-section of a cylindrically-shaped SC sample after activation. The looping lines 52, 53 represent the magnetic lines of field external to the sample, while the vectors B represent the magnetic field internal to the sample. FIG. 6 is a perspective view of a pair of SC magnetic samples, chosen in this instance as cylinders, wherein the internal magnetic field lines are represented schematically by vectors shown at the visible end of each such sample. It is to be understood that the internal magnetic fields extend the lengths of the cylinders, and that each cylindrical sample has an external magnetic field associated therewith, of the general nature of that shown in FIG. 5, e.g., force lines 52, 53. FIG. 7 is a simple schematic representation of a pair of hollow polygonal SC magnetic samples. If the equal but opposite angle through which each has been rotated is $\theta$, and if $B_o$ represents the field strength of each such member in the vertical direction prior to rotation, then the horizontal component of the fields may be represented by $B \sin \theta$. In this manner, one may manipulate the cylinders 61 and 62, or the members 71 and 72, so as to have a chosen component thereof, such as their horizontal components, diminish as desired, or cancel, and thus design the shape of the field.

FIG. 8 illustrates one means of obtaining spatially larger magnets and stronger fields than one may have available to replicate. Each of the individual samples 81, 82, etc. may be constructed by any of the means of this invention to replicate an original and then, while the temperature is maintained below the critical level, be assembled in the end-to-end or 'stacked' arrangement depicted. In this manner, a SC magnetic replicator spatially many times larger than any single pre-existing magnet may be created. Although illustrated as cylinders, it is to be understood that the individual replicators may take any desired shape, and that as many individual replicators as desired may be so 'stacked'. It is also to be understood that each individual replicator may be essentially identical, if a highly uniform field is desired, or each or any combination thereof may have different fields if a complex field is desired.

FIG. 9 illustrates another method of increasing the field strength. As illustrated, each discrete sample is a rectangular, planar sample or chip, but such samples may be of any desired shape and may in fact be curvilinear if desired. In this method, a first sample may be created and activated by any of the principles of this invention, creating an external field in association therewith represented schematically by the vector $B_1$ of FIG. 9A. A second sample 92 may similarly be created; if the same original is used for each replica, $B_1$ will be very nearly the equal of $B_2$. Placing the two samples 91, 92 in close proximity to one another will result in the creation of a resultant field, $B_3$, larger than either of $B_1$ or $B_2$.

For a stronger resultant field, the method of FIG. 10 is preferred. In this method, the two discrete samples are joined or laminated prior to activation, as shown in FIG. 10A. If the field strength of an individually activated sample is B, then, upon activation of the laminated pair of samples, the final field strength will be very closely equal to 2B at a point very near the center of the outer surface of joined element 102 (or at the same distance on the opposite side, i.e., near the center of the outer surface of joined element 101), provided that the resultant field strength is not limited by saturation effects. The final field will be slightly less than 2B only because one sample is further away than the other.

FIG. 11 depicts methods of obtaining still stronger fields. In the method of FIG. 11A, two separate samples, for example, each activated to produce a field strength of B (at a point removed from a major surface by a distance of roughly one-tenth the length of the sample), are brought into close proximity but spaced apart from each other, as shown. The resultant field strength at the point P will be 2B, or twice the field strength at the point from only one of such samples. A preferred method of increasing trapped field in this geometry is to assemble unactivated samples in the geometry shown, and then activate them. In the method of 11B, two sets of two samples each may be first laminated and then activated, and then brought into close proximity; the resultant field strength at the point P will be nearly 4B, except for spacing effects, again providing no saturation. Alternatively, and preferably for many applications, the samples may be just laminated, then brought into close proximity, and then activated. Similarly, as many samples may be laminated as desired, two sets of three laminae being shown in FIG. 11C, although the diminishing returns will as a matter of practicality normally limit such structures to a maximum thickness not more than a few times the distance from the point P to the surface of the first sample.

FIG. 12 depicts an alternate method of combining SC magnetic replicas, designated the 'mosaic' method, in contradistinction to the 'laminate' designation applied to the preceding method. In this method, the samples—which may also be of any desired shape, planar or curvilinear, etc.—are joined in an end-to-end arrangement, or edge-to-edge. The discrete replicas of FIG. 12A may be activated either before or after assembly; in either event, the field strength at point P of such an assembly will be very nearly twice that of one such replica. The procedure may be extended to three 'mosaics', as illustrated in FIG. 12C, for which the resultant field strength will be less than three times that of one replica, or to as many as desired. If a spatially large magnet is available, a large mosaic may be assembled rapidly and cheaply and then activated quite expeditiously. Alternatively, each individual replicator may be activated before assembly to reproduce as large a field as is available, or to reproduce different fields for a complex overall field.

If desired, the mosaic and laminate methods may be combined, as is illustrated in FIG. 13. Again, a stronger field may be obtained if each pair to be laminated is first laminated and then activated.

FIG. 14 illustrates still another method of creating spatially large and strong or complex fields. The substrate 141 shown is cylindrical, but may be of any desired shape. For convenience, only a portion of the surface of substrate 141 is shown covered with individual SC magnetic replicas. The entire surface may be covered with single, powerful replicas, or such portions as may be desired. It should be appreciated that enormously powerful magnets may thus be created. Also several layers (laminae) of replicas may be used, and the entire replica may be activated after fabrication. The field is shown parallel to the longitudinal axis, but may be of any desired direction.

Individual chips, disks, or grains replicating a single powerful field may be activated, maintained below the critical temperature, and assembled on the shaped substrate. Were the substrate to be a cylinder large enough to accommodate a person, say 1 meter diameter and 1 meter in length, it would have approximately 3.14 square meters of surface area. Were this surface to be covered with individual chips with current densities of 200,000 amps/cm$^2$, a field strength on the order of 240,000 Gauss would be created. Such cylinders could be extended as desired.

Complex fields may be created by applying individual chips, disks, or grains of different strengths over the surface area in such patterns as may be desired. They may also be created by activating the entirety after fabrication with the desired field.

As hereinbefore stated, the magnetic replicas of the present invention are particularly useful because of their low cost, low weight, zero power consumption (except for the coolant), and accurate reproduction of field shapes of any multipolarity. In any application which requires a precisely shaped field, the usual requirement is for precision machining and assembly. By the use of the techniques of the present invention, however, when the replica is fabricated (whether with components or as a whole) and is then activated, the replica itself may be a crude rather than precision-machined device. The techniques of this invention will create the precise configuration of the persistent currents within the superconductor needed to copy the impressed field with precision. Thus the requirement for precision has been removed from the exterior to the interior of the device, and the procedure for obtaining such precision automated.

With conventional techniques, beam lines external to accelerators involve many expensive magnets which are usually dipoles and quadrupoles, and even sextuples. One dipole will suffice as the parent for a series of dipole replicas, and one quadrupole as the parent for a series of quadrupole replicas. The cost of a typical beam line, which may have 5 dipole and 20 quadrupole replicas, will be dramatically reduced by use of the replicas of the present invention, perhaps by as much as 90%. Any quench in any of the replicas can be quickly corrected by reinitializing the replica with the desired parent magnet.

In addition, in external beam lines of high energy accelerators, the consumption of electrical energy is an important and often limiting factor. For example, such accelerators are often limited in their operation by agreements with local utilities on maximum power usage, and are limited in the fraction of the year they can operate by the cost of the power, which often is several million dollars per year. Replicas operating with no power drain are thus very attractive.

In aerospace applications, such replicas could be used to save fuel in docking ("Tractor" forces), and for "hold down" forces having frictionless release, etc. The light weight of such replicas is quite attractive in space applications, as is the zero power consumption feature since available power is normally severely limited in such environments. In addition, there are space applications in which even the coolant is not needed due to ambient temperatures below $T_c$.

Replicas can also be used as field magnets in generators, thus decreasing power loss. Similarly they can be used for motors. In sufficient size, they can be used for magnetic resonance imaging magnets, or for levitation or propulsion magnets in transportation, and literally in a myriad of other useful and beneficial applications.

What is claimed is:

1. A non-ferromagnetic, bulk, magnetic field replicator formed of a high-critical-temperature type-II superconductive material, wherein said material comprises either a compound of copper, barium, oxygen, and a fourth element which is either a member of the lanthanide group, or yttrium, or said material comprises a compound of bismuth-strontium-calcium-copper-oxygen, or said material comprises a compound of thallium-barium-calcium-copper-oxygen.

2. The magnetic field replicator of claim 1, wherein the material of said replicator is formed as a hollow or solid cylinder or polygon.

3. The bulk replicator of claim 1, wherein said material comprises a compound of copper, barium, oxygen, and a fourth element which is either a member of the lanthanide group, or yttrium.

4. The bulk replicator of claim 1, wherein said material is of the class $RBa_2Cu_3O_{7-x}$, where R is a lanthanide element other than lanthanum, cerium, praseodymium, promethium, or terbium.

5. The bulk replicator of claim 1, wherein said material comprises $YBa_2Cu_3O_{7-x}$.

6. The bulk replicator of claim 5, wherein said material is a mixture with $YBa_2Cu_3O_{7-x}$.

7. The bulk replicator of claim 5, wherein said material further comprises a mixture with $RBa_2Cu_3O_{7-x}$, where R is of the class including cerium, praseodymium, promethium terbium, and the Lanthanide elements.

8. The bulk replicator of claim 1, wherein said material is a mixture of a plurality of materials of the class $RBa_2Cu_3O_{7-x}$, where R is one of the Lanthanide elements.

9. The bulk replicator of claim 1, wherein said material comprises a bismuth-strontium-calcium-copper-oxygen compound.

10. The bulk replicator of claim 1, wherein said material comprises a thallium-barium-calcium-copper-oxygen compound.

11. The bulk replicator of claim 1, wherein the atomic crystalline structure of said material comprises at least one distortion in the lattice structure thereof.

12. The bulk replicator of claim 11, further comprising a plurality of magnetic dipoles in a colinear array within said superconducting material.

13. The bulk replicator of claim 11, wherein the atomic crystalline structure of said material comprises an impurity therein.

14. The bulk replicator of claim 11, wherein at least a first distortion in the crystalline lattice of said material is comprised of superconductive material having a critical temperature different from the critical temperature of the adjoining material.

15. The bulk replicator of claim 11, wherein at least one distortion in the atomic crystalline lattice of said material comprises a nucleus displaced therefrom.

16. The bulk replicator of claim 15, wherein at least one distortion of the atomic crystalline structure of said material is caused by bombarding said material with high-energy heavy particles.

17. The bulk replicator of claim 16, having at least an additional distortion comprising a third superconductive material having a critical temperature different than the critical temperatures of the adjoining material and of the first distorting material.

18. The bulk replicator of claim 13, wherein said impurity comprises a homogeneous impurity.

19. The bulk replicator of claim 13, wherein said impurity comprises a metal.

20. The bulk replicator of claim 13, wherein said impurity comprises silver.

21. The bulk replicator of claim 1, wherein the atomic crystalline structure of said replicator comprises at least one large grain therein.

22. The bulk replicator of claim 21, wherein at least one large grain comprises material including silver.

23. The magnetic field replicator of claim 1, wherein said material comprises plurality of crystalline grains, arranged in a mosaic pattern.

24. The bulk replicator of claim 23, wherein a plurality of said grains are oriented substantially according to a pre-determined pattern.

25. The bulk replicator of claim 23, wherein a plurality of said grains are oriented randomly.

26. The bulk replicator of claim 23, wherein a plurality of said grains are oriented such that their respective preferred planes of conduction are substantially aligned with a pre-determined pattern.

27. The bulk replicator of claim 23, comprising a layer of more than one grain in a mosaic relationship therebetween and in addition a partial layer of at least one additional grain.

28. The replicator of claim 27, wherein a plurality of the grains comprising said additional layer are oriented according to a pre-determined pattern.

29. The replicator of claim 28, wherein the pattern of said additional layer is a random pattern.

30. The bulk replicator of claim 23, wherein at least one such grain comprises a plurality of magnetic dipoles in a colinear array within the high critical temperature type II superconductive material of the grain.

31. The replicator of claim 23, wherein at least one first grain mechanically supports at least one second grain in at least a face-to-face relationship only partially overlapping.

32. The bulk replicator of claim 23, further comprising a first plurality of such grains supported in at least a partial face-to-face relationship by a second plurality of such grains.

33. The bulk replicator of claim 32, wherein said first plurality and said second plurality of such grains are separated by material which is non-superconductive at a temperature at which said first and second pluralities are superconductive.

34. A method of forming a superconductive magnetic field replicator, comprising forming at least one grain of a high-critical-temperature type-2 superconductive material with a plurality of intentionally introduced distortions within the crystalline lattice thereof, wherein said intentionally introduced distortions are introduced subsequent to the formation of said at least one grain, by bombarding said at least one grain with heavy atomic particles or ions.

35. The method of claim 34, said bombarding further comprising bombarding within 20 degrees of the perpendicular to a preferred conduction plane of said replicator.

36. A method of forming a superconductive magnetic field replicator, comprising forming at least one grain of a high-critical-temperature type-2 superconductive material with a plurality of intentionally introduced distortions within the crystalline lattice thereof, wherein said intentionally introduced distortions are introduced subsequent to the formation of said at least one grain, by bombarding said at least one grain with high-energy neutrons.

37. The method of claim 36, said bombarding further comprising bombarding within 20 degrees of the perpendicular to a preferred conduction plane of said replicator.

38. A method of forming a superconductive magnetic field replicator, comprising forming at least one grain of a high-critical-temperature type-2 superconductive material with a plurality of intentionally introduced distortions within the crystalline lattice thereof, wherein said intentionally introduced distortions are introduced by including at least one elemental or chemical impurity in the composition of said superconductive material.

39. The method of claim 38, wherein said at least one grain comprises a plurality of grains oriented at a plurality of angles to one another such that the maximum magnetic field which can be captured in such replicator is substantially isotropic.

40. The method of claim 38, wherein said material is of the class $RBa_2Cu_3O_{7-x}$ where R is a lanthanide element other than lanthanum, cerium, praseodymium, promethium or terbium.

41. The method of claim 40, wherein said material comprises $YBa_2Cu_3O_{7-x}$.

42. The method of claim 41, wherein said material further comprises a mixture with $LaBa_2Cu_3O_{7-x}$.

43. The method of claim 38, wherein said material is a mixture of a plurality of materials in the class $RBa_2Cu_3O_{7-x}$ where R is of the Lanthanide elements.

44. The method of claim 38, further comprising forming at least a first distortion of superconductive material having a critical temperature different than the critical temperature of the adjoining material of another portion of the atomic crystal structure which we will call the second critical temperature.

45. The method of claim 44, further comprising forming at least an additional distortion comprising a superconductive material of critical temperature different than the critical temperatures of the second critical temperature of claim 44, and the critical temperature of claim 44 of the adjoining material and of said first distorting material.

46. A method of making a persistent magnet comprising:
a) forming a plurality of grains of crystalline high-temperature type II superconductive material, wherein each of said plurality of grains contain a plurality of distortions in the crystalline lattice of each said grain,
b) assembling said plurality of grains into an assembly in the shape of a hollow member,
c) activating said assembly with a magnetic field according to the warm or cool method of activation.

47. A method of manufacturing a non-ferromagnetic, bulk, magnetic field replicator comprising: forming said bulk replicator of Type II superconductive material, where the atomic crystal structure of said replicator comprises at least one distortion in the lattice structure thereof, wherein said at least one distortion in said lattice structure is comprised of an impurity therein.

48. The method of claim 47, wherein said material is a mixture of a plurality of materials of the class $RBa_2Cu_3O_{7-x}$ where R is of the Lanthanide elements.

49. The method of claim 47, wherein said material comprises a high critical temperature, Type II superconductive material.

50. The method of claim 49, further comprising orienting its external magnetic field of greatest intensity perpendicular to a major surface of said replicator, to within 20 degrees.

51. The method of claim 49, wherein said material is of the class $RBa_2Cu_3O_{7-x}$ where R is a lanthanide element other than lanthanum, cerium, praseodymium, promethium or terbium.

52. The method of claim 49, wherein said material comprises $YBa_2Cu_3O_{7-x}$.

53. The method of claim 52, wherein said material further comprises a mixture with $LaBa_2Cu_3O_{7-x}$.

54. The method of claim 52, wherein said material further comprises a mixture with $RBa_2Cu_3O_{7-x}$ where R is of the class including cerium, praseodymium, promethium terbium, and the Lanthanide elements.

55. The method of claim 47, wherein said impurity comprises a homogeneous impurity.

56. The method of claim 47, wherein said impurity comprises a metal.

57. The method of claim 47 wherein said impurity comprises silver.

58. The method of claim 47, wherein the atomic crystal structure of said replicator comprises at least one large grain therein.

59. The method of claim 58, wherein the one or more large grains comprises material including metal.

60. The method of claim 58, wherein at the one or more large grains comprises material including silver.

61. The method of manufacturing a non-ferromagnetic, bulk magnetic field replicator comprising:
    (a) forming at least one grain of high critical temperature Type II superconductive material by any methods of grain formation known to those practiced in the arts of growth of crystals, or faulty crystals called grains, and
    (b) supporting said grain on a supporting structure.

62. The method of claim 61, further comprising:
    (a) forming a plurality of such grains, and
    (b) supporting such grains in a mosaic relationship.

63. The method of claim 62, further comprising orienting such grains such that there is no preferred direction of the magnetic field capturing ability of said replicator.

64. The method of claim 61, further comprising:
    (a) forming a plurality of such grains, and
    (b) orienting a plurality of such grains substantially according to a pre-determined pattern.

65. The method of claim 64, wherein such orienting is done without establishing a preferred direction.

66. The method of claim 64, further comprising orienting the respective preferred planes of conduction of such plurality within 20 degrees of a pre-determined pattern.

67. The method of claim 61, further comprising:
    (a) forming a plurality of such grains, and
    (b) supporting such grains with the respective preferred planes of conduction of said plurality-are oriented within 20 degrees of perpendicularity to a pre-determined pattern.

68. The method of claim 61, further comprising forming at least a partial additional layer of at least one additional grain.

69. The method of claim 68, further comprising orienting a plurality of such supported grains according to a predetermined pattern.

70. The method of claim 61, further comprising forming at least one such supported grain so as to comprise a plurality of magnetic dipoles in a colinear array.

71. The method of claim 61, further comprising forming at least a second grain of high critical temperature Type II superconductive material.

72. The method of claim 71, further comprising at least one such first grain supporting at least one such second grain in at least a partial face-to-face relationship.

73. A method for manufacturing a high-temperature superconducting magnetic field replicator, comprising:
    (a) cooling such replicator to a temperature below the superconducting temperature of at least one volumetric constituent portion of such replicator;
    (b) impressing an external magnetic field on such replicator by the method of warm or cool activation;
    (c) increasing the strength of such magnetic field to a level equal to or greater than the first maximum magnetic field strength to which at least one constituent of such replicator can be activated; and
    (d) decreasing to near zero the strength of said magnetic field impressed on such replicator.

74. The method of claim 73, wherein the strength of said impressed field is decreased by separating the source of said field and such replicator.

75. The method of claim 73, wherein the strength of said impressed magnetic field is decreased to substantially zero.

76. The method of claim 73, further comprising introducing a distortion produced by deposit of an impurity, change of phase of the superconductor, change of $T_C$ of the superconductor, radiation damage or other modification of the crystal of size comparable to, or several times larger than, the dielectron coherence length, into the lattice structure of such superconductive magnetic field replicator.

77. A method for manufacturing a high-temperature superconducting magnetic field replicator, comprising:
    (a) impressing on said replicator by warm or cool methods of activation an external magnetic field of any strength less than the second critical magnetic field strength of at least one constituent of such replicator;
    (b) cooling such replicator to a temperature below the superconducting temperature of said replicator; and
    (c) substantially decreasing the strength of said external magnetic field impressed on such replicator.

78. The method of claim 77, wherein the strength of said impressed field is decreased by separating the source of said field and such replicator.

79. The method of claim 77, wherein the strength of said impressed magnetic field is decreased to substantially zero.

80. The method of claim 77, further comprising introducing a distortion into the lattice structure of such superconductive magnetic field replicator.

81. In a method for increasing the field strength retained by a high-temperature superconductive material, that improvement comprising forming the atomic crystal structure of said material so as to include at least one distortion thereof, said distortion comprising an impurity within said material.

82. A method of decreasing the time rate of decay of magnetic field retained in a high temperature superconductive magnetic field replicator, comprising: activating the high-temperature superconducting magnetic field replicator to field strength less than the maximum field strength trappable by such replicator, wherein said activating step comprises:
    (a) placing such replicator in the magnetic field being replicated, and
    (b) cooling such replicator through the superconductivity transition temperature of at least one constituent of such replicator.

83. The method of claim 82, further comprising reducing the magnetic communication from such activator to such replicator to near zero.

84. A method of decreasing the time rate of decay of magnetic field retained in a high temperature superconductive magnetic field replicator, comprising;
    (a) activating such replicator to an initial field strength, and
    (b) aging such replicator until its rate of decay is not in excess of a desired rate of decay.

85. The method of claim 84, wherein such replicator is aged for a week.

86. The method of claim 84, wherein such replicator is aged for more than a week.

87. The method of claim 84, wherein such replicator is aged for more than two months.

88. The method of claim 87, wherein such replicator is aged for more than six months.

89. An improved method of limiting the time rate of decay of magnetic field retained in a high temperature superconductive magnetic field replicator, the improvement comprising;
    (a) activating a replicator to an initial field strength;
    (b) aging such a replicator for an initial time period to determine a decay rate in linear time;
    (c) converting such linear time decay rate to a corresponding decay rate in logarithmic time; and (d) determining from such logarithmic time decay rate a second time period for aging such a replicator so that the decay rate in linear time subsequent to said aging may be not in excess of a desired decay rate.

90. A method of increasing the maximum magnetic field trappable in a bulk replicator comprising:
   (a) determining the direction in which the replicator has its maximum trappable field
   (b) orienting said replicator and an activator with respect to one another such that the impressed magnetic field of said activator will be parallel to such direction of maximum trappable field of said replicator, and
   (c) activating said bulk replicator.

91. The method of claim 90, wherein said bulk replicator is formed of high critical temperature, Type II superconductive material and said activating step is performed by the warm method of activation.

92. The method of claim 91, further comprising activating said replicator to a desired fraction of maximum trappable field by impressing a corresponding activating field upon said replicator.

93. The method of claim 90, wherein said bulk replicator is formed of high critical temperature, Type II superconductive material and said activating step is performed by the cool method of activation.

94. A method of determining the strength of activating field required to produce a trapped field which is a desired fraction of maximum trappable field, comprising:
   (a) successively activating a bulk magnetic field replicator with various activating fields, $B_O$ and determining the trapped fields, $B_T$ corresponding to such various activating fields, and constant c,
   (b) determining the maximum trappable field, $B_T(MAX)$ from the relationship $B_T = B_{T(MAX)}[e^{-cB_O/B_{T(MAX)}}]$,
   (c) determining $B_T$ from said desired fraction and $B_T(MAX)$, and
   (d) determining the value of activating field, $B_O$, from said relationship corresponding to $B_T$ as said desired fraction of $B_T(MAX)$.

* * * * *